(12) United States Patent
Mori (10) Patent No.: US 8,576,378 B2
(45) Date of Patent: Nov. 5, 2013

(54) ILLUMINATION OPTICAL SYSTEM, EXPOSURE APPARATUS, AND DEVICE MANUFACTURING METHOD

(75) Inventor: Kenichiro Mori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 454 days.

(21) Appl. No.: 12/239,059

(22) Filed: Sep. 26, 2008

(65) Prior Publication Data

US 2009/0086185 A1    Apr. 2, 2009

(30) Foreign Application Priority Data

Oct. 1, 2007  (JP) ................................ 2007-258040

(51) Int. Cl.
G03B 27/72 (2006.01)
G03B 27/54 (2006.01)

(52) U.S. Cl.
USPC ............................................. 355/71; 355/67

(58) Field of Classification Search
USPC ............................................. 355/53, 71, 67
See application file for complete search history.

(56) References Cited

U.S. PATENT DOCUMENTS

| | | | |
|---|---|---|---|
| 7,508,493 B2 * | 3/2009 | Takeuchi et al. ................ | 355/71 |
| 2005/0206871 A1 * | 9/2005 | Tsuji ................................ | 355/71 |
| 2005/0264885 A1 * | 12/2005 | Albert ............................ | 359/489 |
| 2005/0280794 A1 * | 12/2005 | Tsuji ................................ | 355/67 |
| 2006/0055834 A1 | 3/2006 | Tanitsu et al. | |
| 2006/0109446 A1 * | 5/2006 | De Winter et al. .............. | 355/71 |
| 2006/0170901 A1 * | 8/2006 | Tanitsu et al. ................... | 355/71 |
| 2006/0171138 A1 | 8/2006 | Muramatsu et al. | |
| 2006/0250600 A1 * | 11/2006 | Tsuji ................................ | 355/71 |
| 2007/0081139 A1 * | 4/2007 | Fukuhara et al. ............... | 355/71 |
| 2007/0258077 A1 * | 11/2007 | Tanaka et al. ................... | 355/71 |
| 2007/0263192 A1 * | 11/2007 | Bubke et al. .................... | 355/53 |
| 2008/0074632 A1 | 3/2008 | Tanitsu et al. | |
| 2008/0094602 A1 | 4/2008 | Tanitsu et al. | |

FOREIGN PATENT DOCUMENTS

| | | |
|---|---|---|
| TW | 200511392 A | 3/2005 |
| TW | 200801842 A | 1/2008 |
| WO | 2004/051717 A1 | 6/2004 |

OTHER PUBLICATIONS

Max Born and Emil Wolf, Smith-Helmholtz formula, Principles of Optics I, pp. 225-228 (Japanese text with English translation).
Taiwanese Office Action issued in counterpart Appln No. 097136472 on Oct. 18, 2012.

\* cited by examiner

*Primary Examiner* — Peter B Kim
*Assistant Examiner* — Deoram Persaud
(74) *Attorney, Agent, or Firm* — Carter, DeLuca, Farrell & Schmidt LLP (57) ABSTRACT

An illumination optical system comprises a first polarization control unit which is located between a light source and a pupil of an illumination optical system, and a second polarization control unit which is located between the first polarization control unit and the pupil, wherein a region on the pupil includes a plurality of partial regions which are classified into a first group including a partial region having a largest area, and a second group including a partial region different from the partial region having the largest area, and the second polarization control unit controls a polarization state in the partial region which belongs to only the second group.

9 Claims, 11 Drawing Sheets

ASYMMETRICAL TANGENTIALLY POLARIZED HEXAPOLE 3

ASYMMETRICAL TANGENTIALLY POLARIZED HEXAPOLE 4

POLARIZATION DIRECTION
(DIRECTION OF ELECTRIC FIELD VECTOR)

FIG. 12

TANGENTIALLY POLARIZED PENTAPOLE

CIRCULARLY POLARIZED LIGHT

RANDOMLY POLARIZED LIGHT

CIRCULARLY POLARIZED LIGHT

POLARIZATION DIRECTION
(DIRECTION OF ELECTRIC FIELD VECTOR)

FIG. 13

ILLUMINATION OPTICAL SYSTEM, EXPOSURE APPARATUS, AND DEVICE MANUFACTURING METHOD

BACKGROUND OF THE INVENTION

1. Field of the Invention

The present invention relates to an illumination optical system, an exposure apparatus, and a device manufacturing method.

2. Description of the Related Art

Devices such as a semiconductor device can be manufactured by a lithography process. A projection exposure apparatus is used in the lithography process. The lithography process includes a process of projecting a circuit pattern onto a substrate (e.g., a silicon substrate or glass substrate) coated with a photosensitive material, thereby transferring the circuit pattern onto the photosensitive material.

Along with the recent advance of the micropatterning of semiconductor devices, a pattern having a line width of 0.15 μm or less is transferred onto a substrate. The advance of the micropatterning of semiconductor devices improves the packing density, which makes it possible to manufacture low-power, high-performance semiconductor devices. Under the circumstances, a high demand has arisen for further advance of the micropatterning of semiconductor devices. Along with this demand, another high demand, in turn, has arisen for an improvement in the resolving power of the projection exposure apparatus.

The relationship among a resolving power R (a line & space pitch that can be transferred), a numerical aperture NA of the projection optical system, and a wavelength λ of the exposure light is given by:

$$R = k1 \times \lambda / NA \quad (1)$$

where k1 is a coefficient.

As is obvious from equation (1), to increase the resolving power (to decrease the value of R), it is only necessary to shorten the wavelength λ of the exposure apparatus or increase the numerical aperture NA of the projection optical system. For this reason, conventionally, the NA of the exposure apparatus has been increasing and the wavelength of the exposure light has been shortening.

Unfortunately, the recent study has revealed that along with an increase in NA, p-polarized light (a light component whose electric field vector lies on a plane including the light component and the normal to the substrate when it strikes the substrate) decreases the contrast of interference fringes in the resist. In view of this, to improve the resolving power by increasing the NA, it is necessary to attain polarized illumination which uses only s-polarized light (a light component whose electric field vector is perpendicular to that of the p-polarized light) by eliminating the p-polarized light along with an increase in NA.

This is because the resist is exposed depending on the strength of the electric field component of the light. As the NA increases, the electric field vector of the p-polarized light generates no interference fringes, resulting in an intensity distribution having a uniform intensity irrespective of the position on it.

Figure 2:
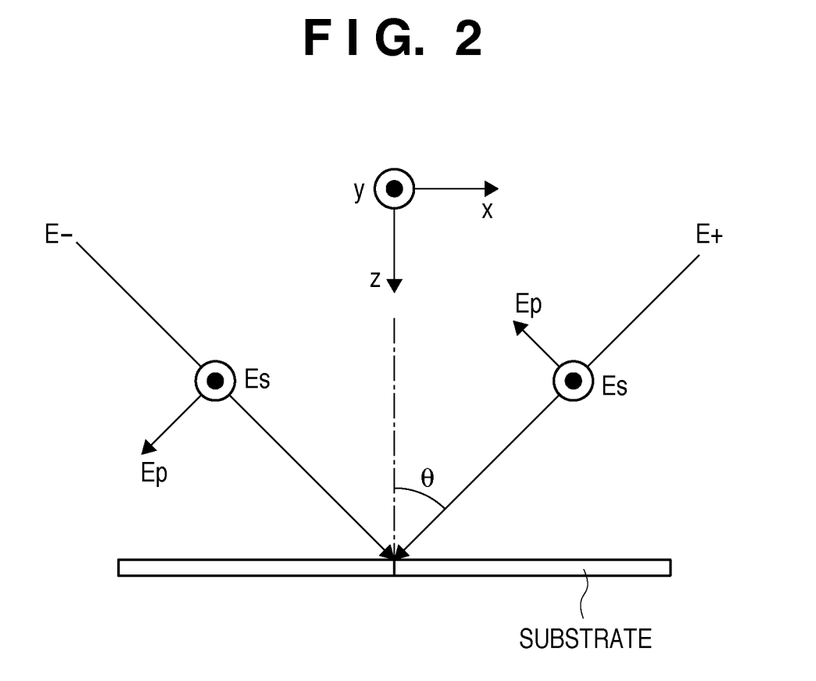
FIG. 2 is a diagram for explaining the fact that the contrast changes depending on the polarization state.

Assume a coordinate system as shown in FIG. 2, on which interference fringes are formed by interference between two diffracted light beams $E_+$ and $E_-$. This specification assumes the z direction as the optical axis direction, and the z-axis as the normal to the x-y plane. Note that when the optical axis is bent by a mirror, the z direction is also bent. That is, this specification defines the x, y, and z directions on a relative coordinate system which uses the optical axis direction as a reference.

Referring to FIG. 2, the diffracted light beams $E_+$ and $E_-$ each include s-polarized light (amplitude: Es) whose electric field vector is parallel to a substrate W, and p-polarized light (amplitude: Ep) perpendicular to the s-polarized light.

The diffracted light beams $E_+$ and $E_-$ are given by:

$$E_+ = \begin{pmatrix} -Ep\cos\theta \\ Es \\ -Ep\sin\theta \end{pmatrix} e^{2\pi i\left(vt - \frac{z\cos\theta}{\lambda} + \frac{x\sin\theta}{\lambda}\right)} \quad (2)$$

$$E_- = \begin{pmatrix} -Ep\cos\theta \\ Es \\ Ep\sin\theta \end{pmatrix} e^{2\pi i\left(vt - \frac{z\cos\theta}{\lambda} - \frac{x\sin\theta}{\lambda}\right)} \quad (3)$$

where ν is the frequency, and λ is the wavelength. For the sake of simplicity, the diffracted light beams $E_+$ and $E_-$ are assumed to be 45° linearly polarized light beams in each of which the s-polarized light is in phase with the p-polarized light.

The sum of the diffracted light beams $E_+$ and $E_-$ is the amplitude of interference fringes and given by:

$$E_+ + E_- = \begin{pmatrix} -2Ep\cos\theta\cos\left(2\pi\frac{x\sin\theta}{\lambda}\right) \\ 2Es\cos\left(2\pi\frac{x\sin\theta}{\lambda}\right) \\ -2iEp\sin\theta\sin\left(2\pi\frac{x\sin\theta}{\lambda}\right) \end{pmatrix} e^{2\pi i\left(vt - \frac{z\cos\theta}{\lambda}\right)} \quad (4)$$

The square of the absolute value of this amplitude is the intensity of the interference fringes and given by:

$$|E_+ + E_-|^2 = 4Ep^2\cos^2\theta\cos^2\left(2\pi\frac{x\sin\theta}{\lambda}\right) + \quad (5)$$
$$4Es^2\cos^2\left(2\pi\frac{x\sin\theta}{\lambda}\right) + 4Ep^2\sin^2\theta\sin^2\left(2\pi\frac{x\sin\theta}{\lambda}\right)$$
$$= 4(Es^2 + Ep^2\cos 2\theta)\cos^2\left(2\pi\frac{x\sin\theta}{\lambda}\right) +$$
$$4Ep^2\sin^2\theta$$

In equation (5), the term:

$$\cos^2\left(2\pi\frac{x\sin\theta}{\lambda}\right) \quad (6)$$

expresses the oscillation amplitude of the interference fringes. In this case, the intensity distribution of a line & space pattern has a period λ/sin θ in the x direction.

Figure 3:
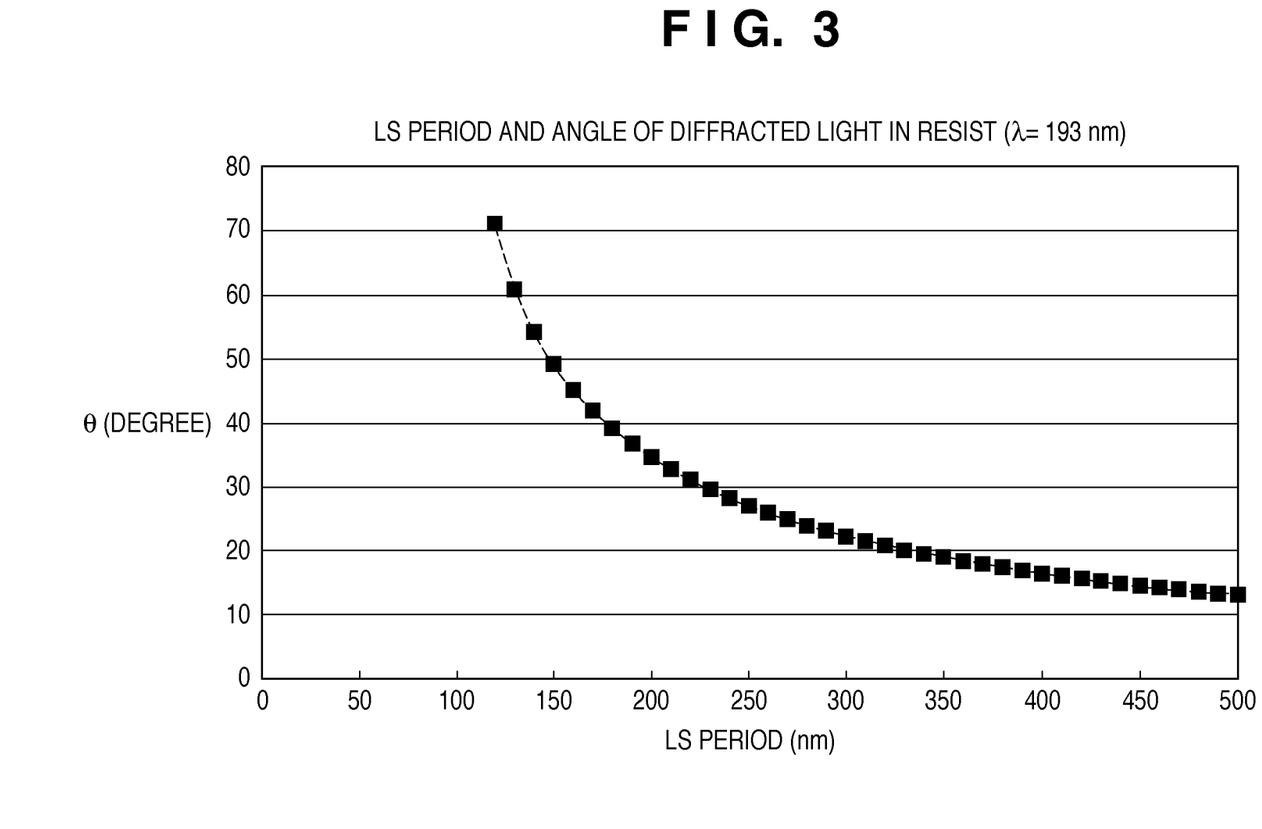
FIG. 3 is a graph showing the LS period and the angle of diffracted light in a resist.

When a micropattern is projected using a high-NA projection optical system, the angle θ between the z-axis and the diffracted light beam becomes larger than when a normal one is used. For example, FIG. 3 shows the angle θ between the z-axis and the diffracted light beam in a photosensitive material (the refractive index in a resist: 1.7) when a line & space pattern having a period of L nm is projected using an ArF laser beam having a wavelength λ=193 nm. The angle θ between the z-axis and the diffracted light beam becomes 45° when the period roughly falls below 160 nm.

As the angle θ becomes 45°, cos 2θ in the coefficient of the term expressed by equation (6) becomes zero, and the term expressed by equation (6) therefore becomes zero. For this reason, the amplitude Ep of the p-polarized light is not reflected on the term of the oscillation amplitude of the interference fringes at all, but is reflected on only $\sin^2 \theta$ that expresses interference fringes which do not oscillate in the x direction. The above-described fact demonstrates that the p-polarized light merely decreases the contrast of the interference fringes.

Whether the diffracted light beam is p-polarized or s-polarized is determined in accordance with the relationship between the diffracted light beam and the substrate. In other words, since the above description is given assuming s-polarized light and p-polarized light for a pattern which extends in the y direction and has a periodicity in the x direction, the s-polarized light is a Y-polarized light component whose electric field vector points in the y direction, and the p-polarized light is an X-polarized light component whose electric field vector points in the x direction. Conversely, when a pattern which extends in the x direction and has a periodicity in the y direction is used, a diffracted light beam is generated in the y direction. In this case, the s-polarized light is an X-polarized light component whose electric field vector points in the x direction, and the p-polarized light is a Y-polarized light component perpendicular to the s-polarized light. In other words, an incident light beam which is s-polarized for a pattern having a periodicity in the x direction turns into that which is p-polarized for a pattern having a periodicity in the y direction. Note that the polarization state changes depending on the reference surface and the light beam incident direction.

As described above, the p-polarized light decreases the contrast of an image in an exposure apparatus having a high-NA projection optical system. To obtain a high-contrast image, it is effective to perform exposure using exposure light including a relatively small amount of p-polarized light and a relatively large amount of s-polarized light. An illumination system which provides polarized illumination, that illuminates the mask in a predetermined polarization state, is therefore important for high-NA lithography in the future.

Figure 4:
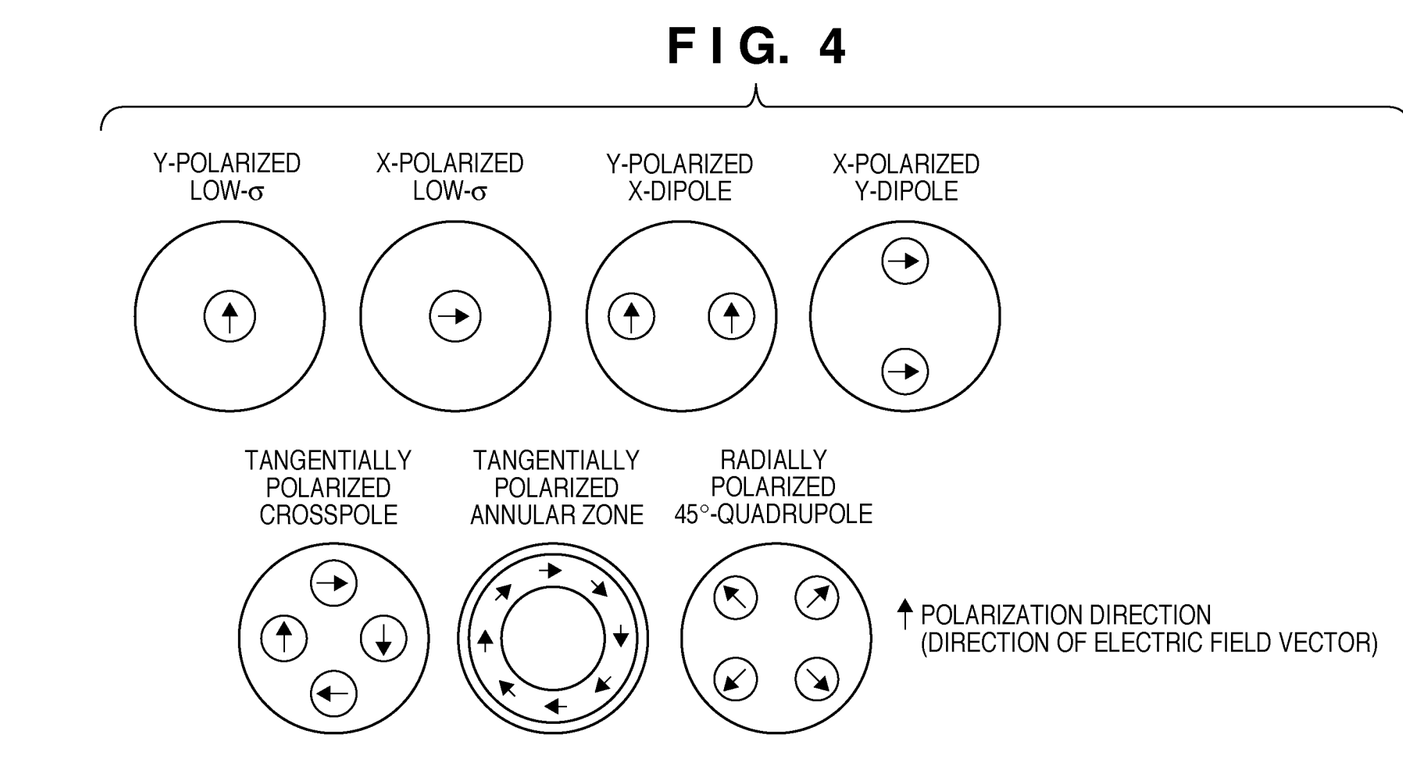
FIG. 4 is a view illustrating the polarization states at the pupil position of the illumination optical system.

FIG. 4 is a view showing the polarization states on the pupil plane of an illumination system attained by the illumination system which provides polarized illumination. Y-polarized low-σ illumination is effective in transferring a repetitive pattern in the x direction when used together with an Alt-PSM. Note that σ is called a coherence factor, which is obtained by dividing the NA of the illumination optical system on its exit side by that of the projection optical system on its incident side. X-polarized low-σ illumination is effective in transferring a repetitive pattern in the y direction when used together with an Alt-PSM. Y-polarized X-dipole illumination is advantageous to transferring a repetitive pattern in the x direction when used together with a binary mask or a halftone mask (also called an Att-PSM). X-polarized Y-dipole illumination is effective in transferring a repetitive pattern in the y direction when used together with a binary mask or Att-PSM. Tangentially polarized crosspole illumination is effective in transferring a pattern as a mixture of repetitive patterns in both the x and y directions when used together with a binary mask or Att-PSM. Tangentially polarized annular illumination is effective in transferring a pattern as a mixture of repetitive patterns in various directions when used together with a binary mask or Att-PSM. The tangential polarization means a polarization state in which the electric field vector points in a direction nearly perpendicular to the direction of the center of the optical axis at each point on the pupil of the illumination system. Radially polarized 45°-quadrupole illumination is effective in transferring a contact hole pattern when used together with a Cr-less PSM. The radial polarization means a polarization state in which the electric field vector points in the direction of the center of the optical axis at each point on the pupil of the illumination system.

Figure 5:
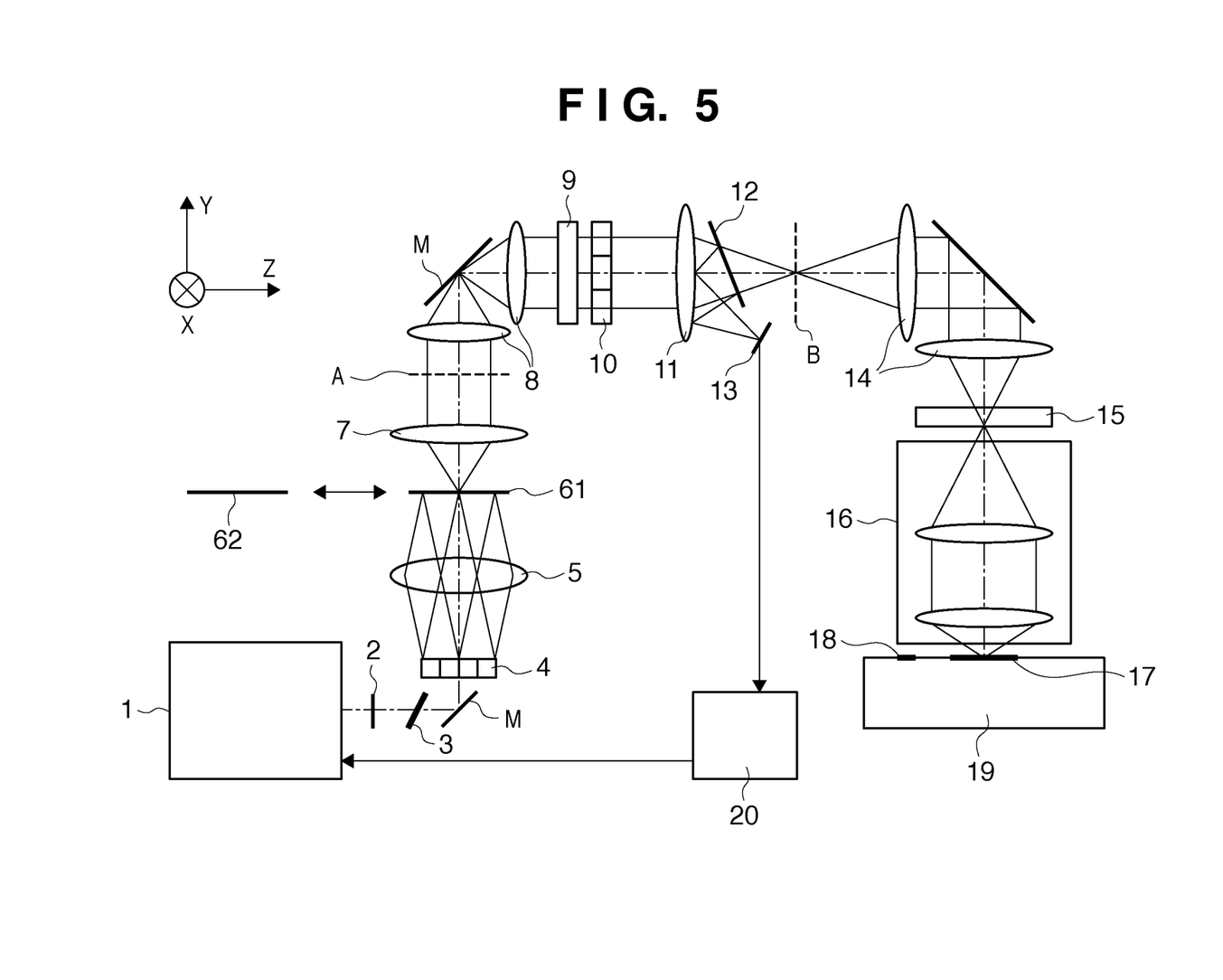
FIG. 5 is a view showing the arrangement of a projection exposure apparatus.

FIG. 5 is a view showing an arrangement example of a projection exposure apparatus having an illumination optical system which illuminates an original with polarized light. An example of this projection exposure apparatus is disclosed in, e.g., PCT(WO) 2004/051717.

A light source 1 provides light to the illumination optical system. The light source 1 is, e.g., an excimer laser. A waveplate (polarization control unit) 2 is, e.g., an optical element made of a birefringent glass material such as quartz crystal or magnesium fluoride. The waveplate 2 collectively converts polarized light provided by the light source 1 into that in a predetermined polarization state.

A neutral density filter (ND) 3 is used to change the illuminance of the illumination light in accordance with the sensitivity of a photosensitive material applied on a substrate 17.

A microlens array 4 makes the incident light emerge with a specific angular distribution so that it enters an optical system, which is set at the succeeding stage of the microlens array 4, while maintaining the same properties, even if the light from the light source 1 is shifted or decentered from the optical axis of the illumination optical system due to vibration of the floor or exposure apparatus. A condenser lens 5 projects the light which has emerged from the microlens array 4 onto a CGH (Computer Generated Hologram) 61. The CGH 61 generates arbitrary diffracted light to form a desired light distribution on the A plane via a condenser lens 7. A microlens array 62 is set to be exchangeable with the CGH 61. When the microlens array 62 is inserted in the optical path, it forms a uniform light distribution on the A plane via the condenser lens 7. A variable magnification relay lens 8 enlarges or reduces the distribution formed on the A plane, and projects it onto an optical integrator 10.

A polarization control unit 9 is formed by arraying a plurality of waveplates, and is used to form effective light sources, which have a plurality of polarization states, on the pupil plane of the illumination optical system. FIG. 4 is a view illustrating effective light sources having a plurality of polarization states.

Figure 9:
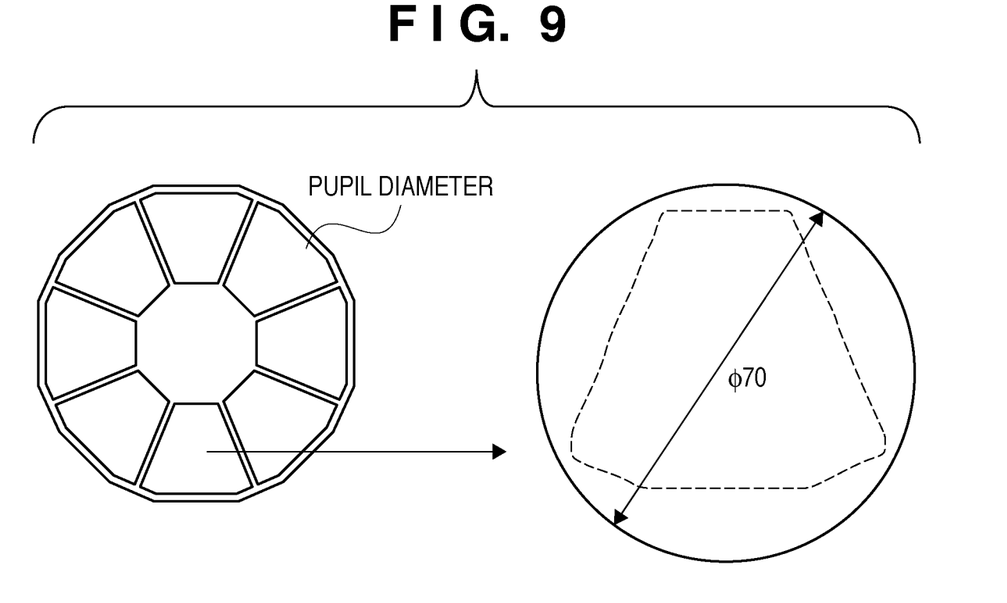
FIG. 9 is a view showing the arrangement of a polarization control unit.

FIG. 9 is a view showing an arrangement example of the polarization control unit 9. FIG. 9 shows the polarization control unit 9 when seen from the optical axis direction. The region on the pupil is divided into eight partial regions. In each partial region, a waveplate compatible with a polarization state to be formed in it is arranged.

The optical integrator 10 forms a plurality of secondary sources at the position of the pupil of the illumination optical system (on the exit surface of the optical integrator 10). The optical integrator 10 can be formed as, e.g., a fly-eye lens or microlens array.

A condenser lens 11 superposes light beams obtained by wavefront splitting of the incident light by the optical integrator 10 to form a nearly uniform intensity distribution on the B plane. A half mirror 12 splits the light toward an exposure amount sensor 13 for controlling the exposure amount. A relay optical system 14 projects the light having the nearly uniform intensity distribution formed on the B plane onto an original (reticle) 15.

A projection optical system 16 projects a circuit pattern drawn on the original 15 onto the substrate (wafer) 17 coated with a photosensitive material. A substrate stage 19 aligns the substrate 17. The substrate stage 19, for example, drives the substrate 17 by scanning for scanning exposure or moves the substrate 17 step by step to switch the shot region. The substrate stage 19 mounts an illuminometer 18. The illuminometer 18 drives the substrate stage 19 at an arbitrary timing so as to be inserted into the exposure region, thereby measuring the illuminance in the exposure region. A control device 20 controls the light source 1 so that the exposure amount of the substrate 17 reaches a target one, on the basis of the output from the exposure amount sensor 13.

To perform polarized illumination by controlling the light polarization state by a waveplate, the waveplate must be fabricated so as to generate a precise phase difference. Details of this fabrication will be explained with reference to FIG. 6. Letting d be the substrate thickness, and $\Delta N$ be the birefringence amount of a birefringent glass material, a ½-waveplate 101 made of this material must be fabricated so as to satisfy a phase difference $\delta\phi$ of (180+360×m) degree (m: natural number) with respect to light having a wavelength $\lambda$. The phase difference significantly changes even when the thickness d of the waveplate 101 shifts from a target value by only several micrometers, so the thickness d must be controlled precisely.

Figure 6:
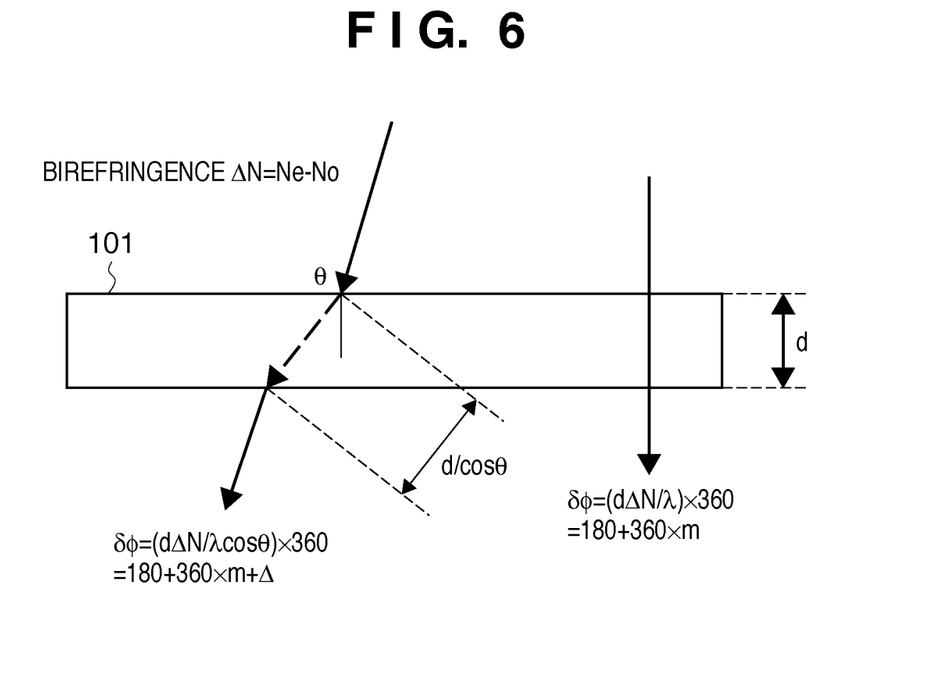
FIG. 6 is a diagram for explaining the thickness of a waveplate and a generated phase difference.

To generate a precise phase difference by the waveplate 101 made of a birefringent glass material, it is also necessary to set the incident angular range with respect to the waveplate 101 to be relatively narrow. When the light enters the waveplate 101 at an angle $\theta$ with respect to the normal incident light as shown in FIG. 6, the length of an optical path that passes through the waveplate 101 increases more than when the light vertically enters the waveplate 101. Therefore, the exit light from the waveplate 101 exhibits a phase error of $\Delta$ degree.

Figure 7:
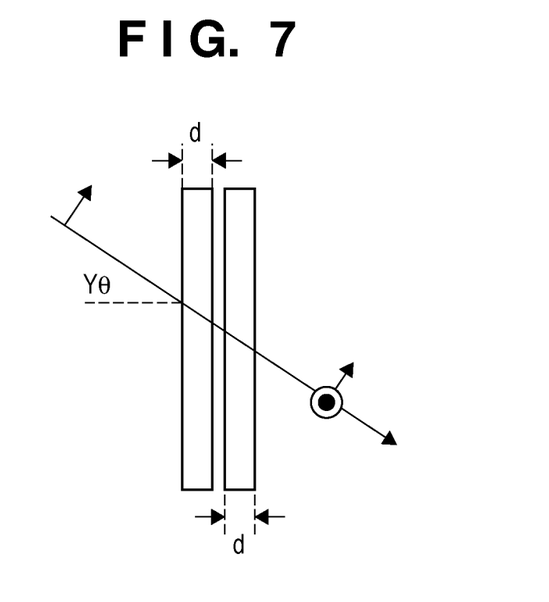
FIG. 7 is a diagram for explaining the incident angle/plate thickness and the calculation conditions of the purity of polarization.
Figure 8:
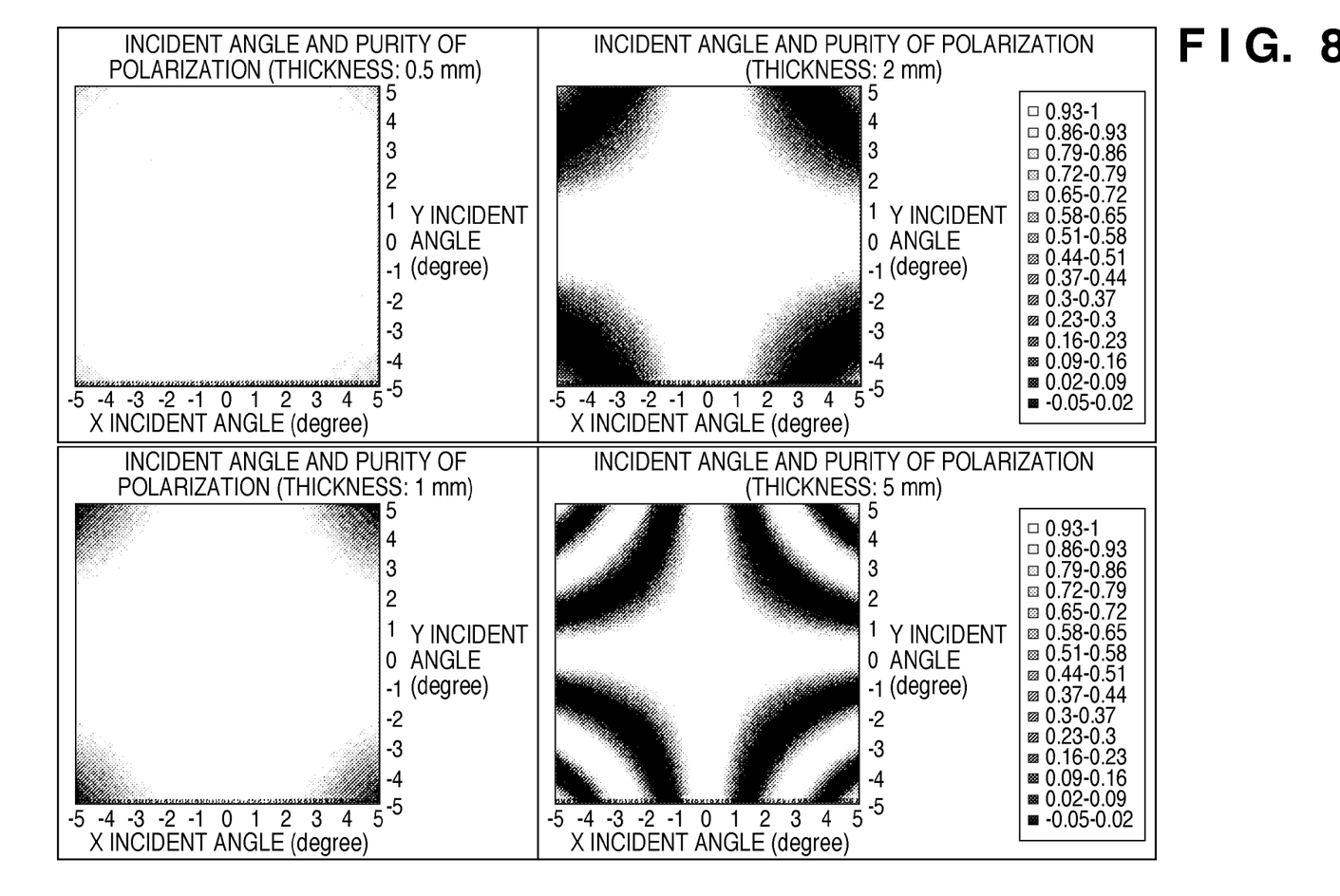
FIG. 8 is a chart showing the relationship between the incident angle/plate thickness and the purity of polarization.

Consider a case in which light enters a pair of waveplates (0th-order ½-waveplates) made of a birefringent glass material as shown in FIG. 7 with a certain angle. FIG. 8 shows the result of simulating the purity of polarization while changing the thickness Ix of the waveplates.

Letting Ix be the intensity of light which oscillates in the x direction, and Iy be that of light which oscillates in the y direction, the purity of polarization is defined as Ix/(Ix+Iy). The polarization state of light which enters the waveplates is Y-polarization (Iy=1 and Ix=0), and the waveplates each are a ½-waveplate whose fast axis is in the 45° direction with respect to the X-axis. Since incident light having an incident angle of 0° (Y-polarized light) is converted into X-polarized light by the ½-waveplates into X-polarized light, the purity of polarization is 1.

FIG. 8 shows the relationship between the thickness d (mm) of the waveplates and the purity of polarization. The ordinate and abscissa indicate the incident angles of the incident light with respect to the waveplates in the x and y directions, and the color density represents a change in the purity of polarization. The white color indicates high purity of polarization, and the black color indicates low purity of polarization. The result shown in FIG. 8 reveals that the purity of polarization of the exit light depends on the incident angle and the thickness of the waveplates. The larger the thickness of the waveplates and the larger the incident angle, the larger a change in the purity of polarization.

The above-described fact reveals that the purity of polarization on the target illumination surface decreases when a thick waveplate is used and a waveplate is arranged at a position at which the incident angular distribution exhibits a large incident angle in a projection exposure apparatus. In this case, the image contrast decreases and therefore an ED window reduces, resulting in degradation in the yield of a chip. When a waveplate made of a birefringent glass material is used for an exposure apparatus, it is desirable to arrange a thin waveplate (which, preferably, has a thickness of 0.5 mm or less) at a position at which the incident angle is small (preferably, ±3° or less).

Birefringent glass materials such as quartz crystal and fluoride magnesium each have a limit of a fabricable outer diameter from the viewpoint of limitations associated with a furnace to grow its crystal. In general, the diameter of the fabricable crystal of quartz crystal is up to about 70 mm. A crystal of quartz crystal having a diameter larger than that value takes much time for crystal growth, and it is difficult to control impurities contained in it. For these reasons, such a crystal is very expensive and is therefore hard to supply stably. To use a waveplate made of quartz crystal produced commercially, it is necessary to set the light beam effective diameter of the waveplate to 70 mm or less.

The incident angle and the light beam diameter have a tradeoff relationship in the optical path. This is known as the general principle of optics and is introduced as the Smith-Helmholtz formula in, e.g., Max Born and Emil Wolf, "Principles of Optics I" trans. Toru Kusakawa and Hidetsugu Yokota, Tokai University Press, pp. 225-228.

To obtain a good purity of polarization, a waveplate must be arranged at a position at which the incident angle is small. However, at the position at which the incident angle is small, the light beam diameter is large, so a required size of the waveplate is large. The size of the waveplate is subject to the limitations on the manufacture of the birefringent glass material, as described above. In view of this, a position to arrange the polarization control unit 9 has conventionally been determined to satisfy the limit of the outer diameter of the birefringent glass material and obtain its largest shape, as shown in the right view of FIG. 9.

Figure 10:
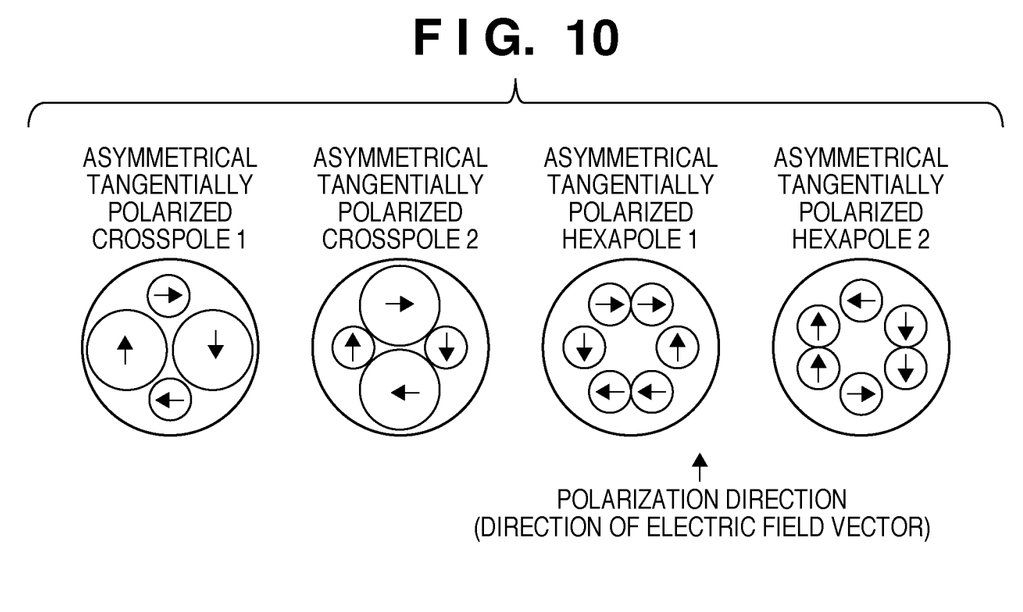
FIG. 10 is a view illustrating the polarization states.

In recent years, however, it is demanded to attain optimal polarization states for individual exposure conditions, e.g., special polarization states as shown in FIG. 10.

When the polarization state in a relatively large partial region distributed on the pupil of the illumination optical system is controlled by a waveplate arranged near the pupil, a required outer shape of the waveplate exceeds the limit of the outer shape of the birefringent glass material. On the other hand, when a waveplate is arranged at a position at which the light beam effective diameter is small to be able to fabricate the waveplate, the incident angle with respect to the waveplate increases. This makes it impossible to obtain a good purity of polarization.

SUMMARY OF THE INVENTION

The present invention has been made in consideration of the above-described problems, and has as its object to provide a technique advantageous to obtaining target polarization states with, e.g., high purity of polarization.

According to the first aspect of the present invention, there is provided an illumination optical system which illuminates a target illumination region with light provided by a light source. The illumination optical system includes a first polarization control unit which is located between the light source and the pupil of the illumination optical system, and controls the polarization state of the light, and a second polarization control unit which is located between the first polarization control unit and the pupil, and controls the polarization state of the light. A region on the pupil includes a plurality of partial regions, and the plurality of partial regions are classified into a first group including a partial region having a largest area, and a second group including a partial region different from that having the largest area. The second polarization control unit controls the polarization state in the partial region which belongs to only the second group.

According to the second aspect of the present invention, there is provided an exposure apparatus which projects the pattern of an original onto a substrate, thereby exposing the substrate. The exposure apparatus includes the above-described illumination optical system which illuminates a target illumination region on the original, and a projection optical system which projects an image of the pattern of the original onto the substrate.

According to the first aspect of the present invention, there is provided a polarization control unit which is configured to control a polarization state of light and is used between a light source and a pupil of an illumination optical system which illuminates a target illumination region with light provided by the light source, wherein a region on the pupil includes a plurality of partial regions, and the plurality of partial regions being classified into a first group including a partial region having a largest area, and a second group including a partial region different from the partial region having the largest area, the polarization control unit is configured to control a polarization state in the partial region which belongs to only the second group, and the illumination optical system includes another polarization control unit which is located between the light source and the polarization control unit, and is configured to control a polarization state of light.

According to the third aspect of the present invention, there is provided a device manufacturing method. The device manufacturing method includes the steps of, exposing a substrate using the above-described exposure apparatus, and developing the substrate.

According to the present invention, it is possible to provide a technique advantageous to obtaining target polarization states with, e.g., high purity of polarization.

Further features of the present invention will become apparent from the following description of exemplary embodiments with reference to the attached drawings.

DESCRIPTION OF THE EMBODIMENT

A preferred embodiment of the present invention will be described below with reference to the accompanying drawings.

Figure 13:
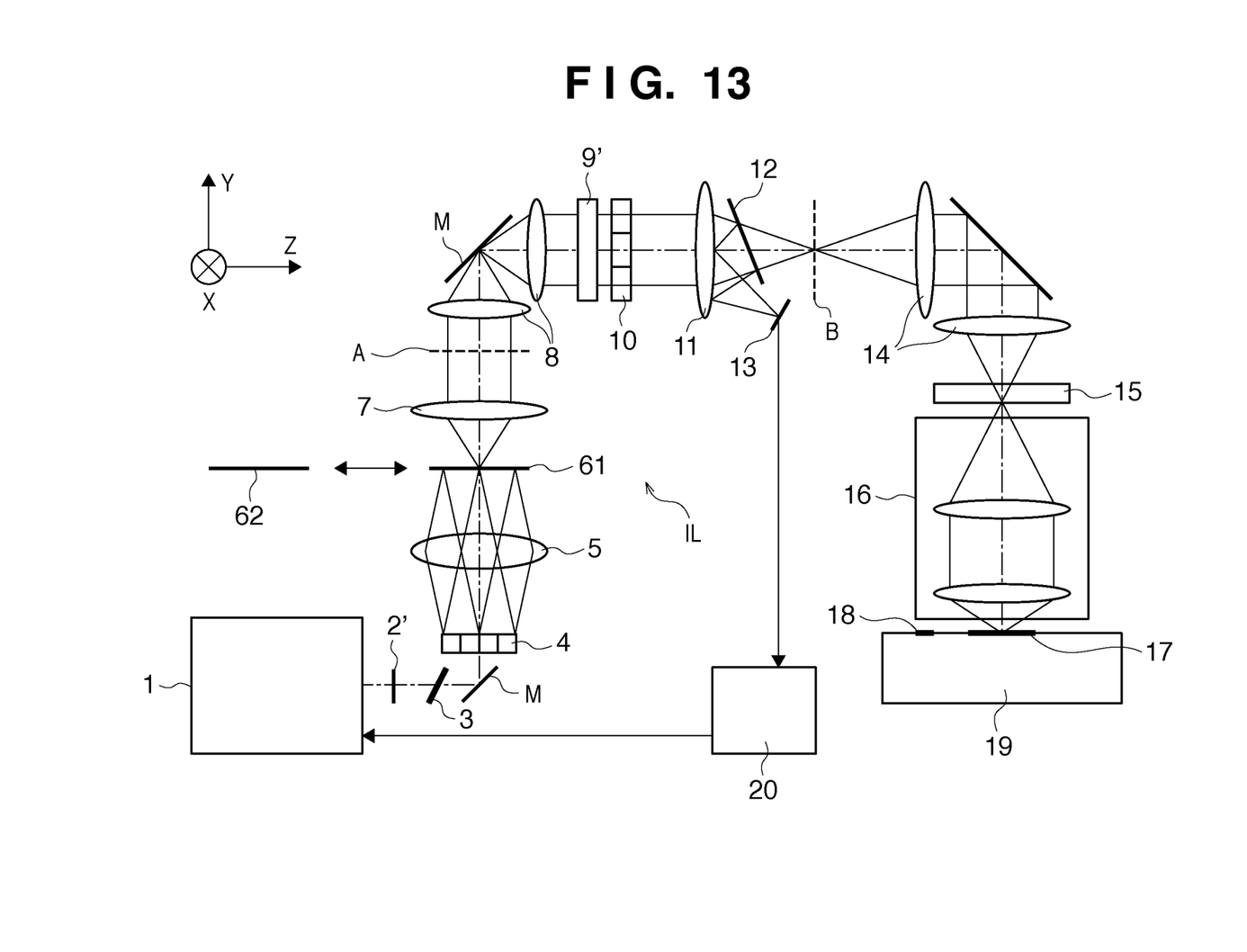
FIG. 13 is a schematic view showing the arrangement of a projection exposure apparatus according to a preferred embodiment of the present invention.

FIG. 13 is a view showing the schematic arrangement of an exposure apparatus according to a preferred embodiment of the present invention. The same reference numerals as in FIG. 5 denote the same constituent elements in FIG. 13, and a description thereof will not be repeated. The exposure apparatus shown in FIG. 13 has an arrangement in which the waveplate 2 and polarization control unit 9 in the illumination optical system of the exposure apparatus shown in FIG. 5 are replaced by a first polarization control unit 2' and second polarization control unit 9', respectively.

The exposure apparatus according to the preferred embodiment of the present invention can comprise an illumination optical system IL for illuminating an original (also called a reticle or mask) 15 or its part as the target illumination region with light provided by a light source 1, and a projection optical system 16 for projecting the pattern of the original 15 onto a substrate 17.

In the example shown in FIG. 13, the illumination optical system IL can be formed from constituent elements denoted by reference numerals 2', 3, M, 4, 5, 61, 7, 8, 9', 10, 11, 12, 13, and 14. The illumination optical system IL comprises the first polarization control unit 2' and second polarization control unit 9' as characteristic constituent elements. The first polarization control unit 2' is inserted between the light source 1 and the pupil of the illumination optical system IL (the exit surface of an optical integrator 10) in the optical path, and controls the light polarization state. The second polarization control unit 9' is inserted between the first polarization control unit 2' and the pupil in the optical path, and also controls the light polarization state. The second polarization control unit 9' is preferably inserted between the first polarization control unit 2' and the pupil in the vicinity of the pupil.

The first polarization control unit 2' can be typically formed from one waveplate. A plurality of first polarization control units 2' are preferably prepared so that an arbitrary first polarization control unit 2' can be selected from them and inserted in the optical path. With this arrangement, an arbitrary illumination mode can be selected from a plurality of illumination modes such as those illustrated in FIG. 1. The plurality of first polarization control units 2' are arrayed on, e.g., a rotary plate, and an arbitrary illumination mode is selectively used by rotating the rotary plate. The plurality of first polarization control units can include, e.g., a first polarization control unit which converts polarized light provided by the light source 1 into X-polarized light, and that which converts polarized light provided by the light source 1 into Y-polarized light.

The second polarization control unit 9' is formed by arraying a plurality of waveplates, and is used to form effective light sources, which have a plurality of polarization states, on the pupil plane of the illumination optical system. A plurality of second polarization control units 9' are preferably prepared so that an arbitrary second polarization control unit 9' can be selected from them and inserted in the optical path. With this operation, of a plurality of illumination modes such as those illustrated in FIG. 1, an arbitrary illumination mode is used selectively.

Figure 1:
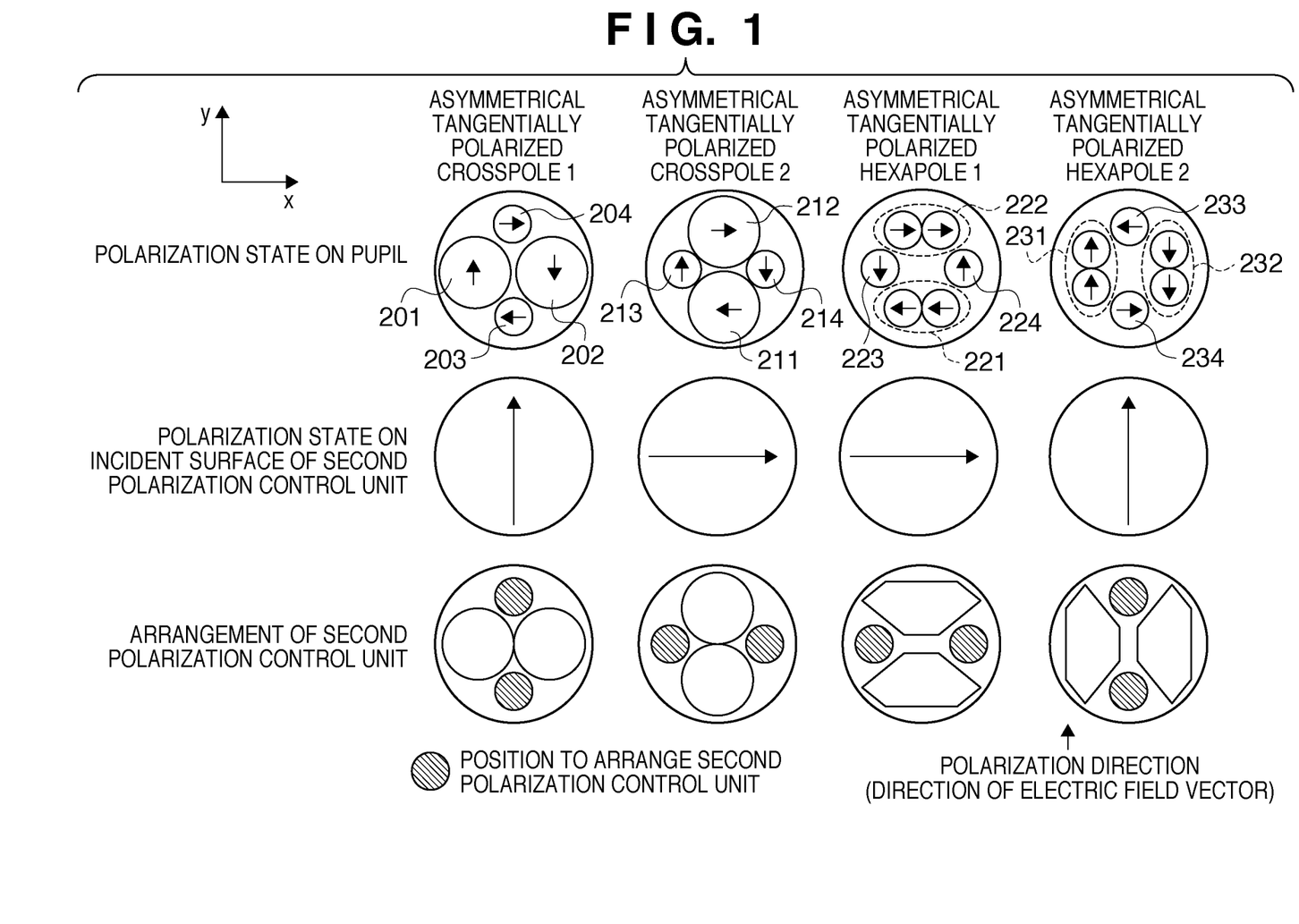
FIG. 1 is a view illustrating the functions of a first polarization control unit and second polarization control unit, and the polarization states on the pupil of an illumination optical system.

FIG. 1 is a view illustrating the functions of the first polarization control unit 2' and second polarization control unit 9', and the polarization states on the pupil of the illumination optical system IL. Referring to FIG. 1, each arrow indicates the polarization direction. Also referring to FIG. 1, the "Polarization State On Pupil" illustrates different polarization states on the pupil of the illumination optical system IL. Also referring to FIG. 1, the "Polarization State On Incident Surface Of Second Polarization Control Unit" illustrates different polarization states on the incident surface of the second polarization control unit 9'. This polarization state is determined by the first polarization control unit 2'. Also referring to FIG. 1, the "Arrangement of Second Polarization Control Unit" illustrates different arrangements of the second polarization control unit 9'. Each of the hatched portions and hollow portions represents a portion through which light passes. Note that each hatched region represents a region to arrange a ½-waveplate. Each hollow portion represents an opening or an optical element which does not change the polarization state (e.g., a flat plate made of a non-birefringent glass material). The polarization state on the pupil of the illumination optical system IL is determined by the first polarization control unit 2' and second polarization control unit 9'. The first polarization control unit 2' is typically set at a position at which the polarization state in the entire region on the pupil of the illumination optical system IL can be controlled collectively, e.g., the position between the light source 1 and the microlens array 4.

The region on the pupil of the illumination optical system IL includes a plurality of partial regions. The plurality of partial regions are classified into a first group including a partial region having a largest area, and a second group including a partial region different from that having the largest area. The second polarization control unit 9' controls the polarization state in the partial region which belongs to the second group of the first group and the second group. That is, of the first polarization control unit 2' and second polarization control unit 9', the first polarization control unit 2' determines the polarization state in the partial region, which has the largest area, on the pupil of the illumination optical system IL. Also, both the first polarization control unit 2' and second polarization control unit 9' determine the polarization state in the partial region, which is different from that having the largest area, on the pupil of the illumination optical system IL. If all of the plurality of partial regions have the same area, at least one of them need only be determined as the partial region having the largest area.

In "Asymmetrical Tangentially Polarized Crosspole 1", the region on the pupil includes a plurality of partial regions 201 to 204. The plurality of partial regions 201 and 204 are classified into a first group including the partial regions 201 and 202 having a largest area, and a second group including the partial regions 203 and 204 different from those 201 and 202. The first polarization control unit 2' forms a polarization state, in which the polarization directions are oriented along the y direction, on the incident surface of the second polarization control unit 9'. The second polarization control unit 9' controls the polarization state in the partial regions 203 and 204 which belong to the second group of the first group and the second group. More specifically, the second polarization control unit 9' rotates the polarization directions of polarized light beams, which enter the partial regions 203 and 204, by ½-waveplates so that they are oriented along the x direction. However, the second polarization control unit 9' does not change the polarization state of polarized light beams which enter the partial regions 201 and 202.

In "Asymmetrical Tangentially Polarized Crosspole 2", the region on the pupil includes a plurality of partial regions 211 to 214. The plurality of partial regions 211 to 214 are classified into a first group including the partial regions 211 and 212 having a largest area, and a second group including the partial regions 213 and 214 different from those 211 and 212. The first polarization control unit 2' forms a polarization state, in which the polarization directions are oriented along the x direction, on the incident surface of the second polarization control unit 9'. The second polarization control unit 9' controls the polarization state in the partial regions 213 and 214 which belong to the second group of the first group and the second group. More specifically, the second polarization control unit 9' rotates the polarization directions of polarized light beams, which enter the partial regions 213 and 214, by ½-waveplates so that they are oriented along the y direction. However, the second polarization control unit 9' does not change the polarization state of polarized light beams which enter the partial regions 211 and 212.

In "Asymmetrical Tangentially Polarized Hexapole 1", the region on the pupil includes a plurality of partial regions 221 to 224. The plurality of partial regions 221 to 214 are classified into a first group including the partial regions 221 and 222 having a largest area, and a second group including the partial regions 223 and 224 different from those 221 and 222. The partial region 221 includes two adjacent poles having the same polarization state, and the partial region 222 includes two adjacent poles having the same polarization state. The first polarization control unit 2' forms a polarization state, in which the polarization directions are oriented along the x direction, on the incident surface of the second polarization control unit 9'. The second polarization control unit 9' controls the polarization state in the partial regions 223 and 224 which belong to the second group of the first group and the second group. More specifically, the second polarization control unit 9' rotates the polarization directions of polarized light beams, which enter the partial regions 223 and 224, by ½-waveplates so that they are oriented along the y direction. However, the second polarization control unit 9' does not change the polarization state of polarized light beams which enter the partial regions 221 and 222.

In "Asymmetrical Tangentially Polarized Hexapole 2", the region on the pupil includes a plurality of partial regions 231 to 234. The plurality of partial regions 231 and 232 are classified into a first group including the partial regions 231 and 232 having a largest area, and a second group including the partial regions 233 and 234 different from those 231 and 232. The partial region 231 includes two adjacent poles having the same polarization state, and the partial region 232 includes two adjacent poles having the same polarization state. The first polarization control unit 2' forms a polarization state, in which the polarization directions are oriented along the y direction, on the incident surface of the second polarization control unit 9'. The second polarization control unit 9' controls the polarization state in the partial regions 233 and 234 which belong to the second group of the first group and the second group. More specifically, the second polarization control unit 9' rotates the polarization directions of polarized light beams, which enter the partial regions 233 and 234, by ½-waveplates so that they are oriented along the x direction. However, the second polarization control unit 9' does not change the polarization state of polarized light beams which enter the partial regions 231 and 232.

Figure 11:
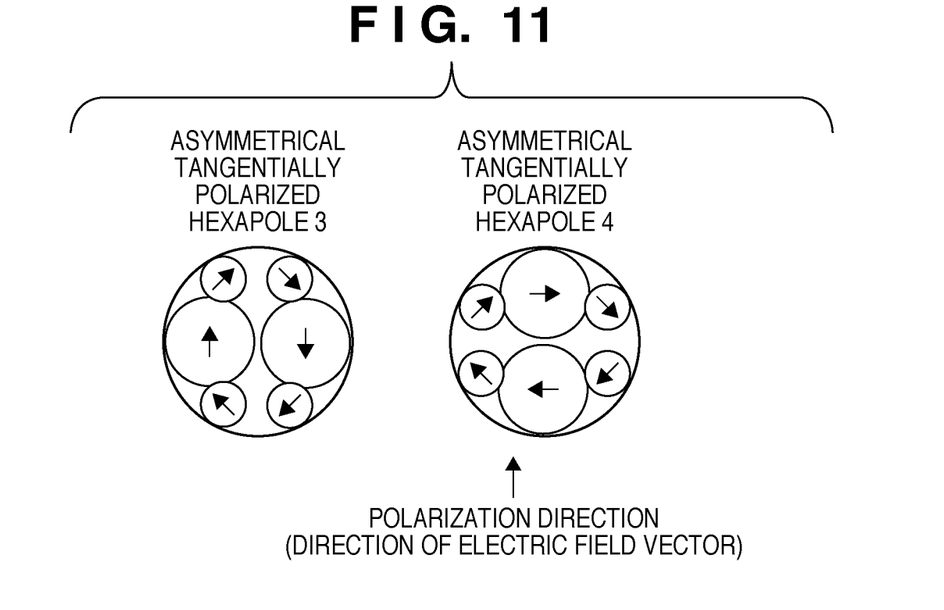
FIG. 11 is a view illustrating the polarization states.
Figure 12:
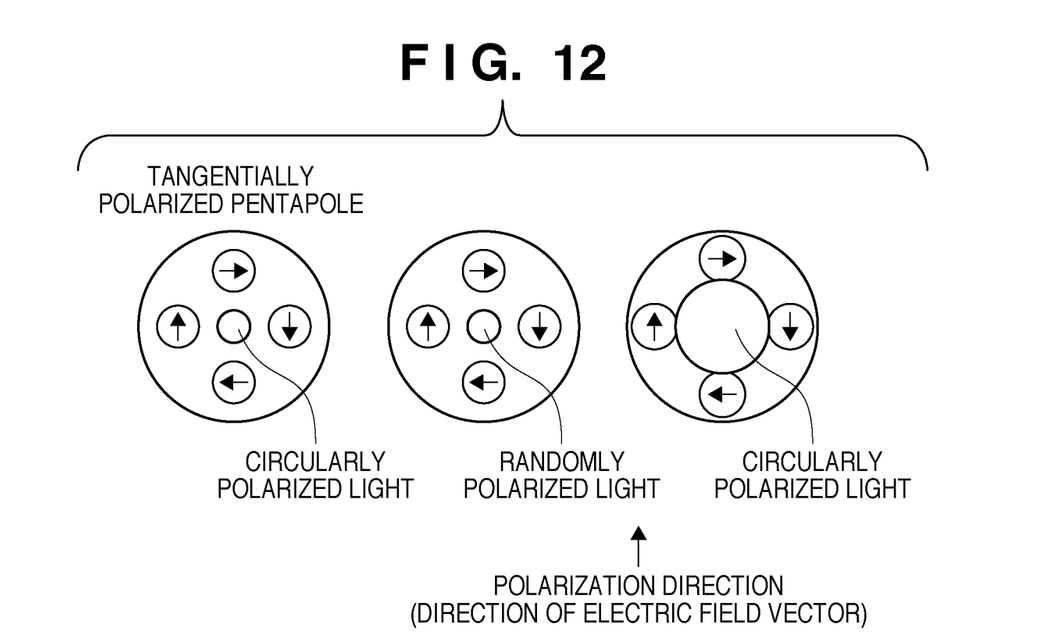
FIG. 12 is a view illustrating the polarization states.

Although a case in which only two polarization states are formed on the pupil of the illumination optical system IL has been exemplified above, the present invention is also applicable to a case in which three or more polarization states as illustrated in FIG. 11 are formed. Also, although a case in which linearly polarized states are formed has been exemplified above, circularly polarized light, randomly polarized light (non-polarized light), and elliptically polarized light may be formed, as illustrated in FIG. 12. In this case, a ¼-waveplate, a depolarizing plate, and an n-waveplate (n: real number) need only be arranged in the circularly polarized light region, non-polarized light region, and elliptically polarized light region, respectively.

If the partial region of the circularly polarized light has a largest area as shown in the rightmost view of FIG. 12, a ¼-waveplate which collectively converts the light polarization state into circular polarization, and that which converts circular polarization into linear polarization need only be arranged as the first polarization control unit and second polarization control unit, respectively.

As has been described above, according to the preferred embodiment of the present invention, the second polarization control unit 9' controls the polarization state in a partial region which belongs to the second group of the first group and the second group, and does not control the polarization state in a partial region which belongs to the first group. Hence, the preferred embodiment of the present invention is advantageous to obtaining target polarization states with high purity of polarization.

A device manufacturing method according to a preferred embodiment of the present invention is suitable to manufacture, e.g., a semiconductor device and liquid crystal device. This method can include a step of transferring the pattern of an original onto a photosensitive material applied on a substrate using the above-described exposure apparatus, and a step of developing the photosensitive material. After these steps, other known steps (e.g., etching, resist removal, dicing, bonding, and packaging) are performed, thereby manufacturing devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-258040, filed Oct. 1, 2007, which is hereby incorporated by reference herein in its entirety.

What is claimed is:

1. An illumination optical system which illuminates a target illumination region with light provided by a light source, comprising:
    a first polarization control unit which is located between the light source and a pupil of the illumination optical system, and is configured to control a polarization state of the light; and
    a second polarization control unit which is located between the first polarization control unit and the pupil, and is configured to control the polarization state of the light,
    wherein a region on the pupil includes a plurality of partial regions, and the plurality of partial regions are classified into a first group including a partial region having a largest area, and a second group including a partial region different from the partial region having the largest area,
    wherein the second polarization control unit changes a polarization state in the partial region which belongs to only the second group,
    wherein a first polarization state formed in the region on the pupil by the first and second polarization control units can be changed to a second polarization state having a polarization state and a position of the partial region of the first group, which are different from those of the first polarization state,
    wherein the first polarization control unit differentiates the polarization state in the partial region of the first group between the first polarization state and the second polarization state by changing a polarization state of light emitted from the first polarization control unit, and
    wherein the second polarization control unit differentiates the position of the partial region of the first group between the first polarization state and the second polarization state by changing a position of a portion of the second polarization control unit, through which light incident on the partial region of the first group passes.

2. The system according to claim 1, wherein the second polarization control unit is located in the vicinity of the pupil and between the first polarization control unit and the pupil, and the first polarization control unit is located at a position other than the vicinity of the pupil, and
    wherein the system comprises a plurality of polarization control units which can be selectively used as the first polarization control unit.

3. The system according to claim 1, wherein the system comprises a plurality of first polarization control units which can be selectively used as the first polarization control unit and a plurality of second polarization control units which can be selectively used as the second polarization control unit.

4. The system according to claim 1, wherein the system comprises a plurality of polarization control units which can be selectively used as the second polarization control unit, each of the plurality of polarization control units including a portion, the light passing therethrough entering the partial region that belongs to the first group, wherein a position, shape or area of the portions of the plurality of polarization control units are different from each other.

5. An exposure apparatus which projects a pattern of an original onto a substrate, thereby exposing the substrate, comprising:
    an illumination optical system as defined in claim 1, which is configured to illuminate a target illumination region on the original; and
    a projection optical system configured to project an image of the pattern of the original onto the substrate.

6. A device manufacturing method comprising:
    exposing a substrate using an exposure apparatus as defined in claim 5; and
    developing the substrate.

7. A polarization control unit which is configured to control a polarization state of light and is used between a light source and a pupil of an illumination optical system which illuminates a target illumination region with light provided by the light source,
    wherein a region on the pupil includes a plurality of partial regions, the plurality of partial regions being classified into a first group including a partial region having a largest area, and a second group including a partial region different from the partial region having the largest area,
    wherein the polarization control unit is configured to change a polarization state in the partial region which belongs to only the second group,
    wherein the illumination optical system includes another polarization control unit which is located between the light source and the polarization control unit, and is configured to control a polarization state of light,
    wherein a first polarization state formed in the region on the pupil by the polarization control unit and the another polarization control unit can be changed to a second polarization state, the second polarization state having a polarization state and a position of the partial region of the first group, which are different from those of the first polarization state, the another polarization control unit differentiating the polarization state in the partial region of the first group between the first polarization state and the second polarization state by changing a polarization state of light emitted from the another polarization control unit, and wherein the polarization control unit differentiates the position of the partial region of the first group between the first polarization state and the second polarization state by changing a position of a portion of the polarization control unit, through which light incident on the partial region of the first group passes.

8. The system according to claim 1, wherein the second polarization control unit includes a portion, the light passing therethrough entering the partial region that belongs to the first group, and wherein the first polarization control unit is controlled in accordance with one of a plurality of polarization states, which is required to be set to the portion.

9. The system according to claim 1, wherein the second polarization control unit differentiates a position of the partial region of the second group between the first polarization state and the second polarization state by changing a portion of the second polarization control unit, through which light incident on the partial region of the second group passes.

* * * * *